US008145923B2

(12) United States Patent
Lakkapragada et al.

(10) Patent No.: US 8,145,923 B2
(45) Date of Patent: Mar. 27, 2012

(54) CIRCUIT FOR AND METHOD OF MINIMIZING POWER CONSUMPTION IN AN INTEGRATED CIRCUIT DEVICE

(75) Inventors: Shankar Lakkapragada, San Jose, CA (US); Scott Te-Sheng Lien, Palo Alto, CA (US); Tetse Jang, San Jose, CA (US); Jesse H. Jenkins, IV, Danville, CA (US); Mark Men Bon Ng, Milpitas, CA (US)

(73) Assignee: Xilinx, Inc., San Jose, CA (US)

( * ) Notice: Subject to any disclaimer, the term of this patent is extended or adjusted under 35 U.S.C. 154(b) by 895 days.

(21) Appl. No.: 12/034,361

(22) Filed: Feb. 20, 2008

(65) Prior Publication Data
US 2009/0210731 A1    Aug. 20, 2009

(51) Int. Cl.
*G06F 1/26* (2006.01)
(52) U.S. Cl. ......... 713/320; 713/300; 713/310; 713/322
(58) Field of Classification Search .................. 713/300, 713/310, 320, 322
See application file for complete search history.

(56) References Cited

U.S. PATENT DOCUMENTS

| 5,028,821 | A |   | 7/1991  | Kaplinsky         |         |
|-----------|---|---|---------|-------------------|---------|
| 5,362,989 | A |   | 11/1994 | Hennedy           |         |
| 5,650,939 | A | * | 7/1997  | Yoshida           | 700/286 |
| 5,832,286 | A |   | 11/1998 | Yoshida           |         |
| 5,887,179 | A | * | 3/1999  | Halahmi et al.    | 713/324 |
| 5,953,237 | A | * | 9/1999  | Indermaur et al.  | 700/295 |
| 5,996,083 | A | * | 11/1999 | Gupta et al.      | 713/322 |
| 6,172,518 | B1|   | 1/2001  | Jenkins et al.    |         |
| 6,625,740 | B1| * | 9/2003  | Datar et al.      | 713/324 |
| 6,785,826 | B1| * | 8/2004  | Durham et al.     | 713/300 |
| 6,789,207 | B1| * | 9/2004  | Maejima           | 713/322 |
| 7,178,044 | B2| * | 2/2007  | Pappalardo et al. | 713/300 |
| 7,348,827 | B2| * | 3/2008  | Rahim et al.      | 327/534 |
| 7,472,296 | B2| * | 12/2008 | Kato et al.       | 713/320 |
| 2002/0053039 | A1 | * | 5/2002 | Inoue et al.      | 713/323 |

(Continued)

FOREIGN PATENT DOCUMENTS

DE    196 15 413 A1    2/1997

OTHER PUBLICATIONS

U.S. Appl. No. 10/783,216, filed Feb. 20, 2004, Tuan, T. et al., entitled, "Tuning Programmable Logic Devices for Low-Power Design Implementation", Xilinx, Inc., 2100 Logic Drive, San Jose, CA.

(Continued)

*Primary Examiner* — Kim Huynh
*Assistant Examiner* — Zahid Choudhury
(74) *Attorney, Agent, or Firm* — John J. King

(57) ABSTRACT

A method of minimizing power consumption in an integrated device is disclosed. The method comprises providing a plurality of circuit blocks having circuits for performing logic functions, wherein each circuit block consumes power in a static state; coupling one of a plurality of operating voltages to each circuit block of the plurality of circuit blocks; enabling a reduction of power consumed by a first set of circuit blocks by way of a first power reduction signal; and enabling a reduction of power consumed by a second set of circuit blocks by way of a second power reduction signal. A circuit for minimizing power consumption in a device is also disclosed.

20 Claims, 10 Drawing Sheets

U.S. PATENT DOCUMENTS

| | | | |
|---|---|---|---|
| 2002/0184547 A1* | 12/2002 | Francis et al. | 713/322 |
| 2003/0131268 A1* | 7/2003 | Kolinummi et al. | 713/300 |
| 2004/0019814 A1* | 1/2004 | Pappalardo et al. | 713/300 |
| 2004/0080340 A1 | 4/2004 | Hidaka | |
| 2005/0188233 A1* | 8/2005 | Park | 713/320 |
| 2005/0258862 A1 | 11/2005 | Rahin et al. | |
| 2005/0289367 A1* | 12/2005 | Clark et al. | 713/300 |
| 2006/0047988 A1* | 3/2006 | Okada | 713/323 |
| 2006/0179329 A1* | 8/2006 | Terechko et al. | 713/300 |
| 2006/0218424 A1* | 9/2006 | Abramovici et al. | 713/323 |
| 2006/0259800 A1* | 11/2006 | Maejima | 713/300 |
| 2007/0150763 A1* | 6/2007 | Yang et al. | 713/300 |
| 2007/0234094 A1* | 10/2007 | Samra et al. | 713/324 |
| 2007/0255970 A1* | 11/2007 | Hottelet et al. | 713/320 |
| 2008/0178030 A1* | 7/2008 | Koizumi | 713/324 |
| 2009/0125742 A1* | 5/2009 | Terechko et al. | 713/323 |
| 2009/0183018 A1* | 7/2009 | Nakamura et al. | 713/323 |
| 2010/0088534 A1* | 4/2010 | Watanabe et al. | 713/340 |
| 2010/0174927 A1* | 7/2010 | Kim et al. | 713/300 |

OTHER PUBLICATIONS

"Using Data Gate in CoolRunner-II CPLDs", XAPP395 (v1.2) Sep. 22, 2003, pp. 1-9, Xilinx, Inc. 2100 Logic Drive, San Jose, CA 95124.

* cited by examiner

CIRCUIT FOR AND METHOD OF MINIMIZING POWER CONSUMPTION IN AN INTEGRATED CIRCUIT DEVICE

FIELD OF THE INVENTION

The present invention relates generally to integrated circuits, and in particular, to a circuit for and method of minimizing power consumption in an integrated circuit (IC) device.

BACKGROUND OF THE INVENTION

Programmable logic devices (PLDS) are a class of integrated circuits which can be programmed by a user to implement user-defined logic functions. PLDs are often used in electronic systems because, unlike custom hard-wired logic circuits or application specific integrated circuits (ASICs), PLDs can be programmed in a relatively short time and can be reprogrammed quickly to incorporate modifications to the implemented logic functions. One major class of PLDs are referred to as programmable logic array (PLA) devices or programmable array logic (PAL) devices. Early PLDs include a group of AND gates which logically ANDs two or more input signals to produce product terms (P-terms), and a group of OR gates which logically ORs two or more of the P-terms generated by the AND gates. The AND gates are typically formed as a matrix of programmable connections where each column connects to an input pin of the PLD, and each row forms a P-term which is transmitted to the group of OR gates. The OR gates may be programmable (i.e., each P-term is programmably connectable to one of several different OR gate outputs), in which case the PLD is referred to as a PLA device. Alternatively, the OR gates may be fixed (i.e., each P-term is assigned to a particular OR gate output), in which case the PLD is referred to as a PAL device. The AND gates and OR gates of PLA and PAL devices implement logic functions represented in the sum-of-products form.

PLA and PAL devices were well-received by logic designers when their implemented logic functions were relatively small. While PLA and PAL circuits are commonly used in PLDs, they may also be used in any other type of integrated circuit, such as an application specific integrated circuit (ASIC) which also has fixed hardware. However, as logic functions have grown increasingly larger and more complex, logic designers were required to couple together two or more small PLDs to provide sufficient logic capacity. Although this process was tolerated during development and testing, it increased the cost and size of production units. This generated a demand for PLDs with increasingly larger logic capacity. To meet the ever-increasing demand for greater capacity, PLDs with increasingly complex architectures have been developed. One popular complex PLD type, known as complex programmable logic devices (CPLDs), includes two or more function blocks connected together and to input/output (I/O) modules by an interconnect matrix such that each of the function blocks selectively communicates with the I/O modules and with other function blocks of the CPLD through the interconnect matrix.

Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose.

Because CPLDs typically use sense amp technology and other circuits that draw current even when static, conventional CPLDs may unnecessarily draw current. To minimize the current, chip designers transfer internal EPROM bits to internal latches called "configuration bits." After the bits transfer, the EPROM is powered down. However, there is still current drawn by other circuits of the CPLD. Further, digital systems often combine a myriad of chips including PLDs with different voltage configurations. For example, designers must interface 2.5V processors with 3.3V memories, both RAM and ROM, as well as 5V buses and multiple peripheral chips. Therefore, a CPLD may require multiple internal voltages.

Accordingly, there is a need for an improved circuit for and method of minimizing power consumption in an integrated circuit device.

SUMMARY OF THE INVENTION

A method of minimizing power consumption in a device is disclosed. The method comprises providing a plurality of circuit blocks having circuits for performing logic functions, wherein each circuit block consumes power in a static state; coupling one of a plurality of operating voltages to each circuit block of the plurality of circuit blocks; enabling a reduction of power consumed by a first set of circuit blocks by way of a first power reduction signal; and enabling a reduction of power consumed by a second set of circuit blocks by way of a second power reduction signal.

According to an alternate embodiment, a method of minimizing power consumption in a device comprises providing a plurality of circuit blocks having circuits for performing logic functions, wherein each circuit block consumes power in a static state; generating a plurality of power control signals, each power control signal controlling an operating voltage of the plurality of operating voltages; coupling a first operating voltage of a plurality of operating voltages to each circuit block of a first set of circuit blocks; coupling a second operating voltage of the plurality of operating voltages to each circuit block of a second set of blocks; and disabling at least a portion of each circuit block of the second set of circuit blocks.

A circuit for minimizing power consumption in a device is also disclosed. The circuit comprises a plurality of circuit blocks having circuits for performing logic functions, wherein each circuit block consumes power in a static state; a plurality of operating voltages, wherein each circuit block of the plurality of circuit blocks is adapted to receive an operating voltage of the plurality of operating voltages; and a power control circuit coupled to the plurality of circuit blocks for coupling a power control signal to each circuit block of the plurality of circuit blocks.

DETAILED DESCRIPTION OF THE DRAWINGS

Figure 1:
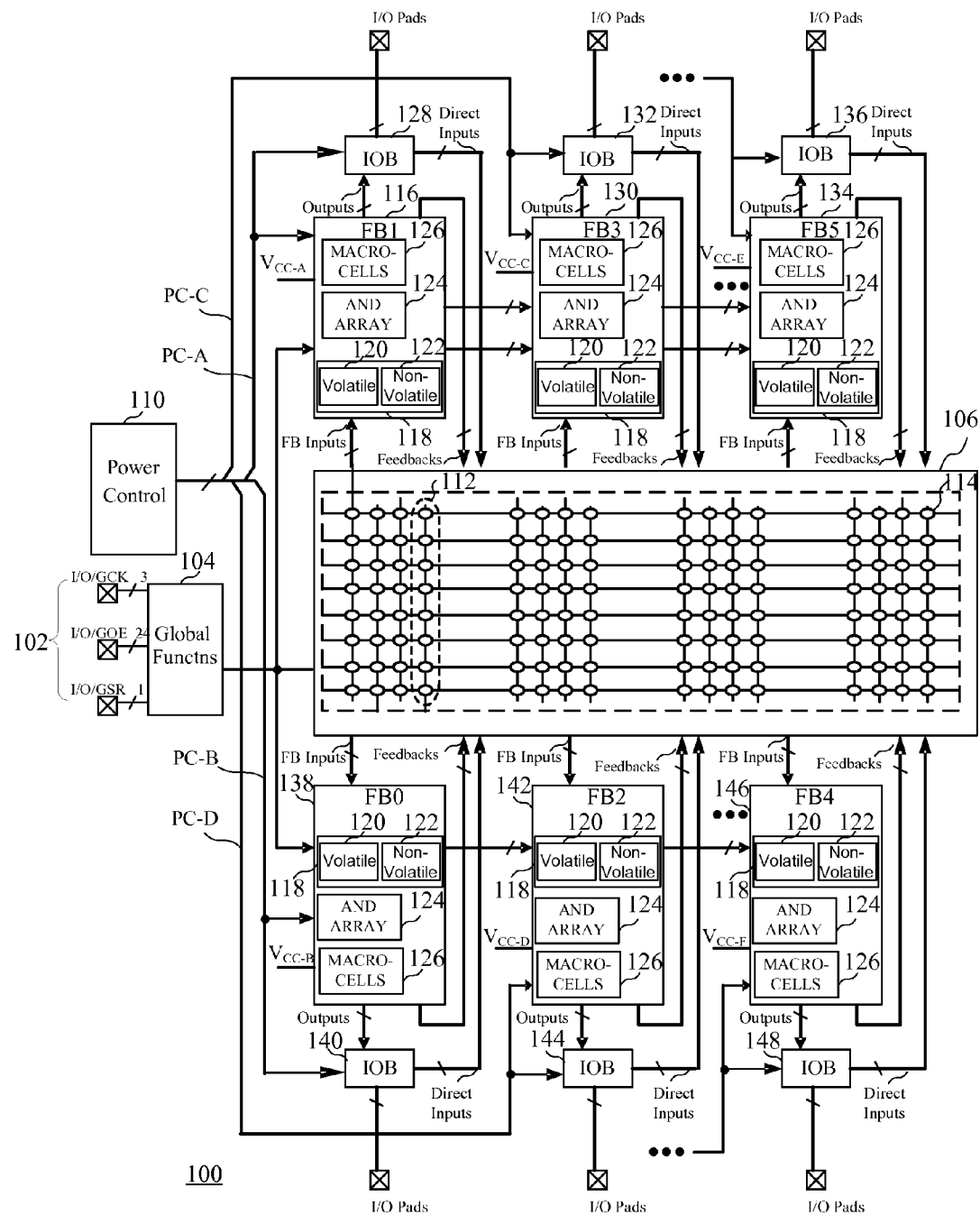
FIG. 1 is a block diagram of a circuit minimizing power consumption in a device having programmable logic according to an embodiment of the present invention.

Turning first to FIG. 1, a block diagram of a circuit minimizing power consumption in a device having programmable logic according to an embodiment the present invention is shown. Note that while examples presented herein may use specific details, such as a CPLD, to describe embodiments of the present invention, the techniques and structures may be used in any integrated circuit or application where the features may be useful. In particular, the circuit of FIG. 1 includes a CPLD having a plurality of input/output pads 102 coupled to a global functions block 104, which may provide clock signals, output enables and set/reset signals to the remaining portions of the CPLD and enable routing of data to and from the internal circuits of the CPLD. The CPLD further includes a plurality of function blocks, which include blocks of programmable logic, and a power control circuit 110, which will be described in more detail below. The function blocks are connected together and to input/output blocks by a programmable interconnection array 106. The programmable interconnection array includes many multiplexer circuits 112, each including several programmable interconnect points (PIPs) 114. Typically, in each multiplexer circuit 112, only one PIP 114 is enabled. The enabled PIP selects one of the many input signals provided to the interconnection array, and the selected input signal is provided as the output signal from the multiplexer circuit 112. For example, a PIP may be enabled by a bit in a configuration bitstream. PLDs also have different "modes" depending on the operations being performed on them. A specific protocol allows a programmable logic device to enter into the appropriate mode. Typical PLDs have internal blocks of configuration memory which specify how each of the programmable cells will emulate the user's logic. During a "program" mode, a configuration bitstream is provided to non-volatile memory, such as a read-only memory (ROM) (e.g., a programmable ROM (PROM), an erasable PROM (EPROM), or an electrically erasable PROM (EEPROM)) either external or internal to the programmable logic device. Each address is typically accessed by specifying its row and column addresses. During system power up of a "startup" mode, the configuration bits are successively loaded from the non-volatile memory into static random access memory (SRAM) configuration latches of a configuration logic block. Each of the function blocks of the circuit of FIG. 1 may have a common configuration. For example, a function block 116 includes configuration memory 118, which may include volatile memory 120 and/or non-volatile memory 122, an AND array 124 and macrocells 126 having programmable logic.

The AND array 124 and macrocells 126 each include circuit blocks for performing logic functions, and particularly enable a sum-of-product (SOP) from selected outputs of the AND gates. As will be described in more detail below, the AND array includes a set of input lines for receiving input signals from the interconnect matrix, and a set of product term (P-term) lines for transmitting P-term signals to the macrocells. Each P-term line is connected to the input lines using programmable connections which allow logic ANDing of two or more of the input signals. Each macrocell includes an OR gate which is programmable to receive one or more of the P-term signals transmitted on the P-term lines. The OR gate of each macrocell produces a sum-of-products term which is either transmitted to the I/O modules of the CPLD, fed back through the interconnect matrix, or is transmitted on special lines to an adjacent macrocell. The function block 116 is also coupled to an input/output block 128. The input/output block 128 also includes a circuit block for performing logic functions. Similarly, a function block 130 is coupled to an input/output block 132, a function block 134 is coupled to an input/output block 136, a function block 138 is coupled to an input/output block 140, a function block 142 is coupled to an input/output block 144, and a function block 146 is coupled to an input/output block 148. Note that the example presented in FIG. 1 is merely representative of one possible arrangement, and in general other arrangements of function blocks, I/O modules, and other circuits may be used.

Figure 2:
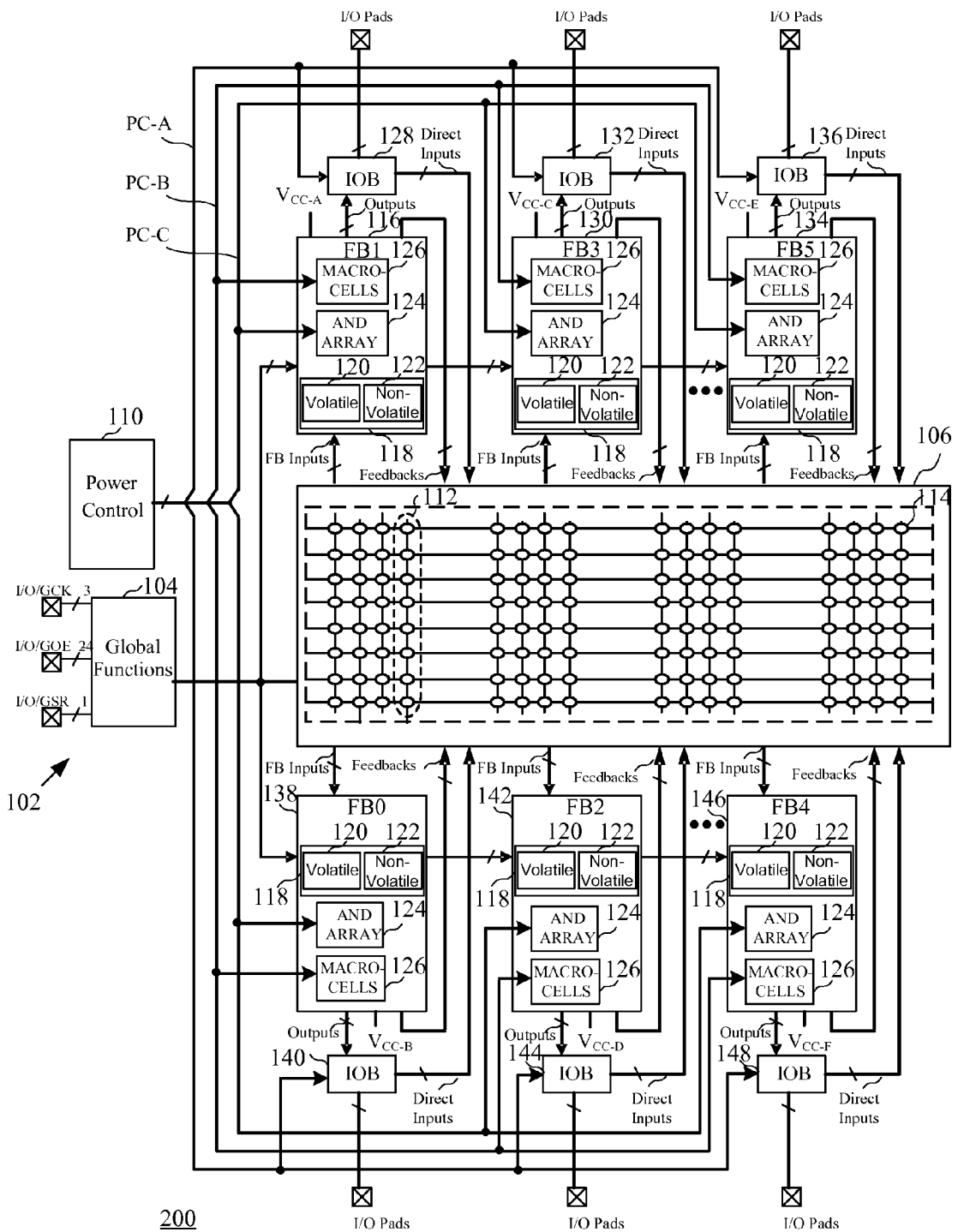
FIG. 2 is a block diagram of a circuit minimizing power consumption in a device having programmable logic according to an alternate embodiment of the present invention.

As shown in the circuit of FIG. 1, a given power control signal minimizes power in a given function block and corresponding input/output block. For example, power control signal A (PC-A) is coupled to minimize power consumption in function block 116 and the corresponding I/O block 128. As will be described in more detail in reference to FIGS. 3-6, the power control signal may control specific portions of the AND array 124, the macrocells 126, and the input/output block 128. Similarly, power control signal B (PC-B) is coupled to minimize power consumption in function block 138 and the corresponding I/O block 140. In contrast, as shown in the circuit of FIG. 2, a given power control signal may be coupled to control a given type of circuit. For example, power control signal A is coupled to control the input/output circuits, while power control signal B is coupled to control macrocells of the function blocks. While the power control signals as shown in FIG. 2 are coupled to all of the common blocks, a first power control signal may be coupled to a first subset of common types of circuits, such as input/output blocks, while a second power control signal may be coupled to a second subset of common types of circuits. Although a single operating voltage is shown applied to each function block of the circuits of FIGS. 1 and 2, different operating voltages may be applied to different circuit blocks within a function block and the I/O block. For example, a different operating voltage may be applied to each of an I/O block, an AND array and a macrocell for a given function block.

Figure 3:
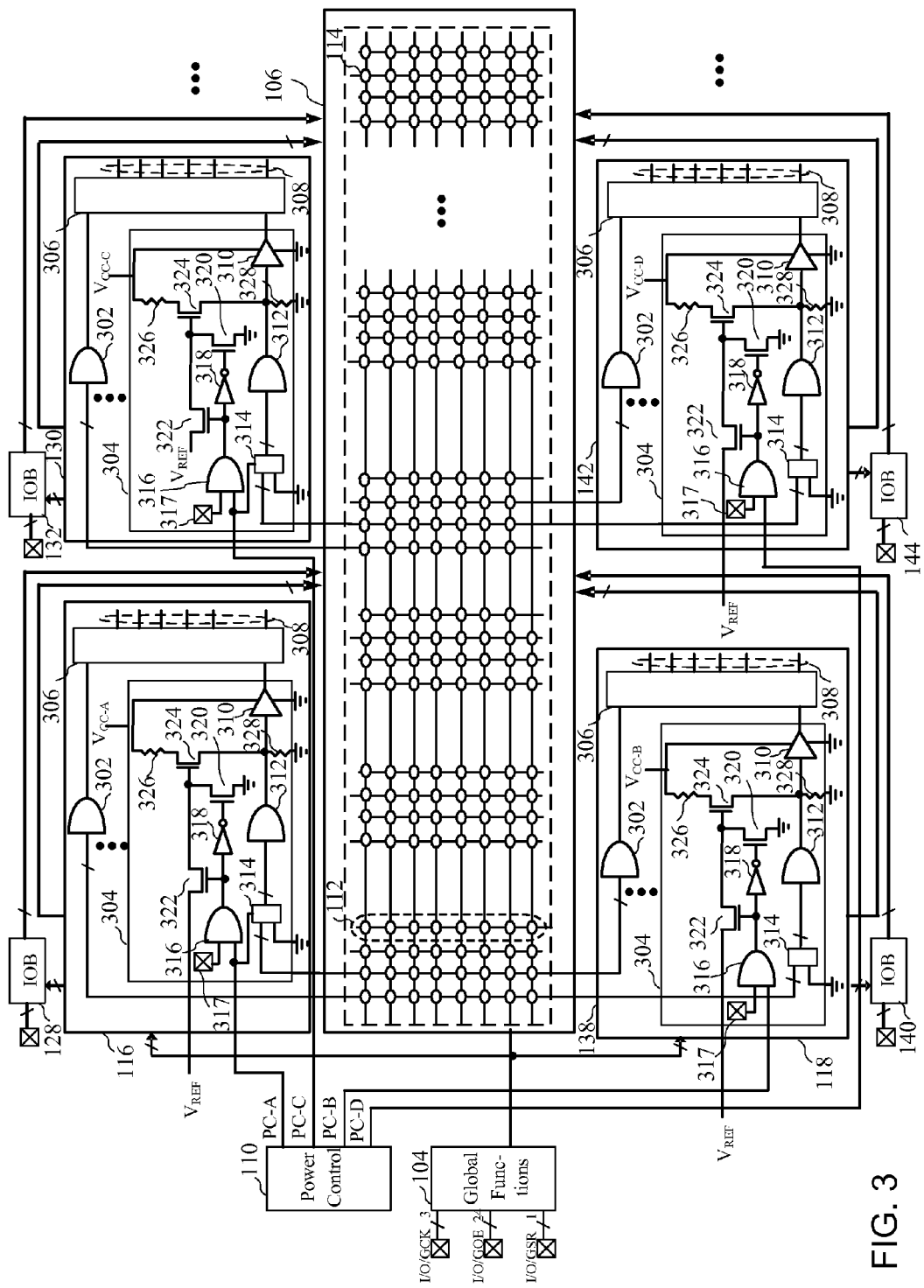
FIG. 3 is a block diagram of a circuit minimizing power consumption in AND arrays of a plurality of function blocks of a CPLD according to an embodiment of the present invention.

Turning now to FIG. 3, a block diagram of a circuit minimizing power consumption in AND arrays of a plurality of function blocks according to an embodiment of the present invention is shown. As shown in FIG. 3, a portion of an AND array includes product term buffers 302 and 304 coupled to a product term allocator 306 generating product term outputs 308. The circuits for minimizing power consumption are shown in more detail with respect to product term buffer 304. In particular, a sense amplifier 310 is coupled to receive the output of an AND gate 312. As will be described in more detail in reference to FIGS. 7 and 8, a power control enable circuit 314 is coupled to receive the outputs of a multiplexer circuit 112 which may be coupled to inputs of the AND gate 312. The multiplexer 112 enables either these outputs or ground signals to be input to the AND gate 312. An AND gate 316 is also couple to receive the power control signal A (PC-A) at a first input and a control signal 317 at a second input. The control signal 317 may be an enable signal which may establish whether that particular AND gate is available to be controlled by a power control signal. That is, power management according to an embodiment of the present invention includes at least one enable bit which allows a specific circuit to selectively participate in the power-down mode and a power control signal which triggers that power-down mode. In FIG. 3, the enable bit is shown by control signal 317 and the power control signal is signal PC-A. By way of example, the control signal may be a memory element storing a value to be input to the AND gate including a bit downloaded as a part of a configuration bitstream. In other examples, other sources, such as an external source or driver, may provide the control signal.

The output of the AND gate 316 is coupled to an inverter 318 which controls a transistor 320 and a transistor 322. In particular, transistor 320 is coupled between the gate of a transistor 324 and ground. Assuming that the product term buffer 304 is enabled to be controlled by the power control signal by applying a logical "1" for control signal 317, when PC-A goes low (i.e., from a logical "1" to a logical "0"), the transistor 322 is turned off, and the inverted output of AND gate 316 is coupled to the gate of transistor 320. The inverted output of the AND gate 316, which is a logical "1," turns on the transistor 320 to pull the gate of the transistor 324 to ground, turning off the transistor which is coupled between a resistor 326 and a resistor 328 and isolating the voltage $V_{CC-A}$ from the sense amplifier 310. That is, when signal PC-A is low, the circuit effectively reduces power consumption in the product term buffer 304 by preventing current flow in the path from $V_{CC-A}$ to the input of the sense amplifier and generating a low output at the output of the AND gate 312. That is, in addition to eliminating the current through resistors 326 and 328, the output of the AND gate 312 remains low by selecting the ground input to the power control enable circuit 314. Note that while sense amplifier 310 is still powered by $V_{CC-A}$, the power consumed in the amplifier is only from normal transistor leakage currents, which is negligible. Further, when control signal 317 is set low, the product term buffer 304 operates only in a power-down mode. By isolating the sense amplifier from the power signal, the power consumption is minimized in the AND gate, thereby reducing the overall power consumption in the device.

Figure 4:
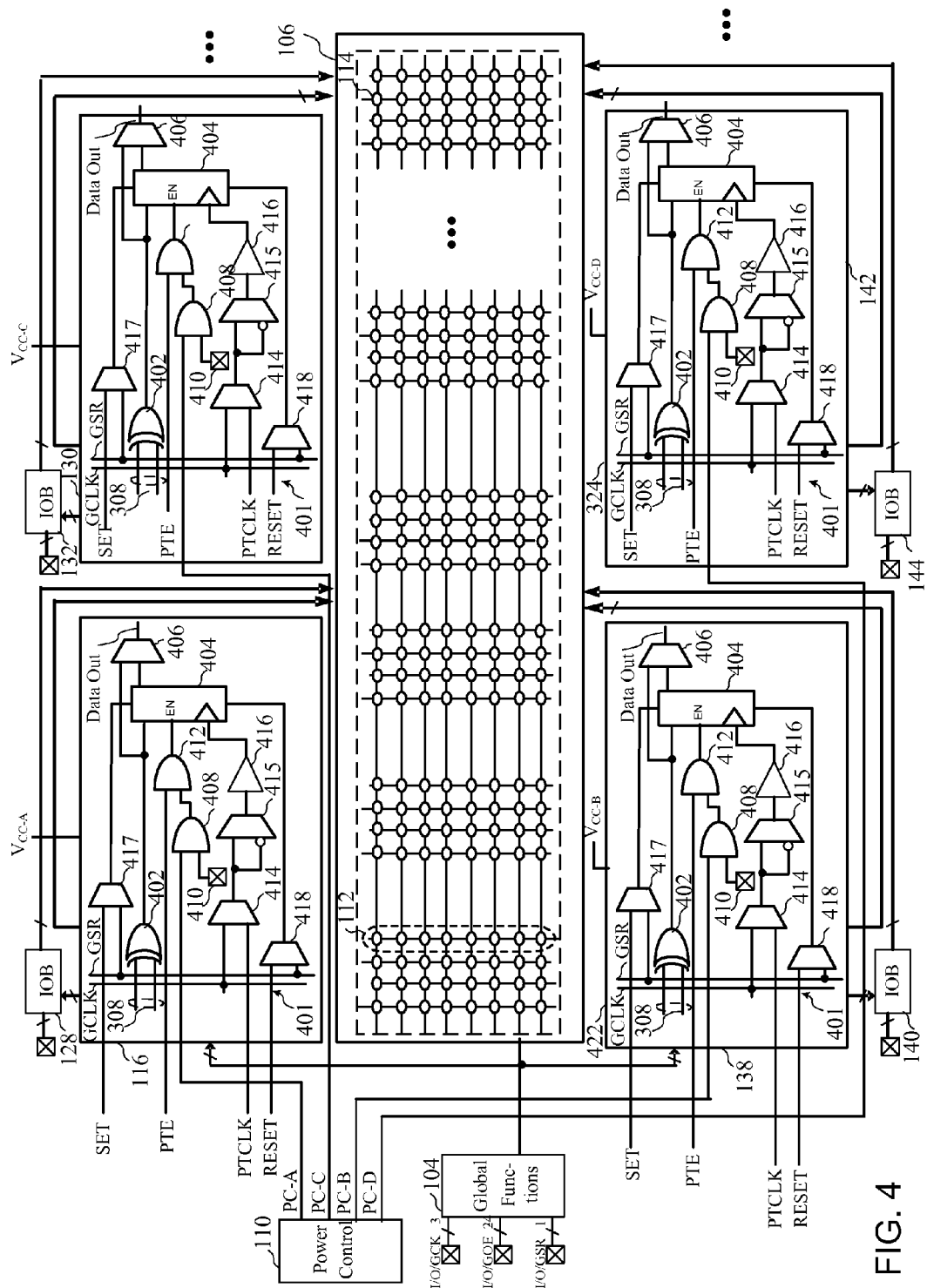
FIG. 4 is a block diagram of a circuit minimizing power consumption in macrocells of a plurality of function blocks of a CPLD according to an embodiment of the present invention.

Turning now to FIG. 4, a block diagram of a circuit minimizing power consumption in macrocells of a plurality of function blocks according to an embodiment of the present invention is shown. In particular, a macrocell 401 of the function block 116 includes an exclusive OR (XOR) gate 402 coupled to receive product terms 308 output from the product term allocator 306. The output of the XOR gate 402 is coupled to an input of a register 404, the output of which is coupled to a multiplexer 406. The multiplexer 406 is coupled to receive the output of the XOR gate 402 or a registered version of the output of the XOR gate 402. The enable of the register 404 is also coupled to an AND gate 408 which receives a power control signal PC-A at a first input and an enable control signal 410. The output of the AND gate is coupled to an input of another AND gate 412 which his also coupled to receive a product term enable (PTE) signal. Assuming that the product term enable is high and the enable control signal 410 is also high, the enable input to the register 404 is dependent upon the power control signal PC-A. A multiplexer 414 is coupled to receive a global clock signal (GLCK) and a global set/reset (GSR) signal. The output of the multiplexer 414 is coupled to an input and an inverted input of the multiplexer 415, the output of which is coupled to the clock input of the register 404 by way of a buffer 416. As can be seen, a plurality of power control signals are coupled to corresponding function blocks. Disabling the register 404 by holding the enable low as shown in the circuit of FIG. 4 also minimizes power consumption in the programmable logic device.

Figure 5:
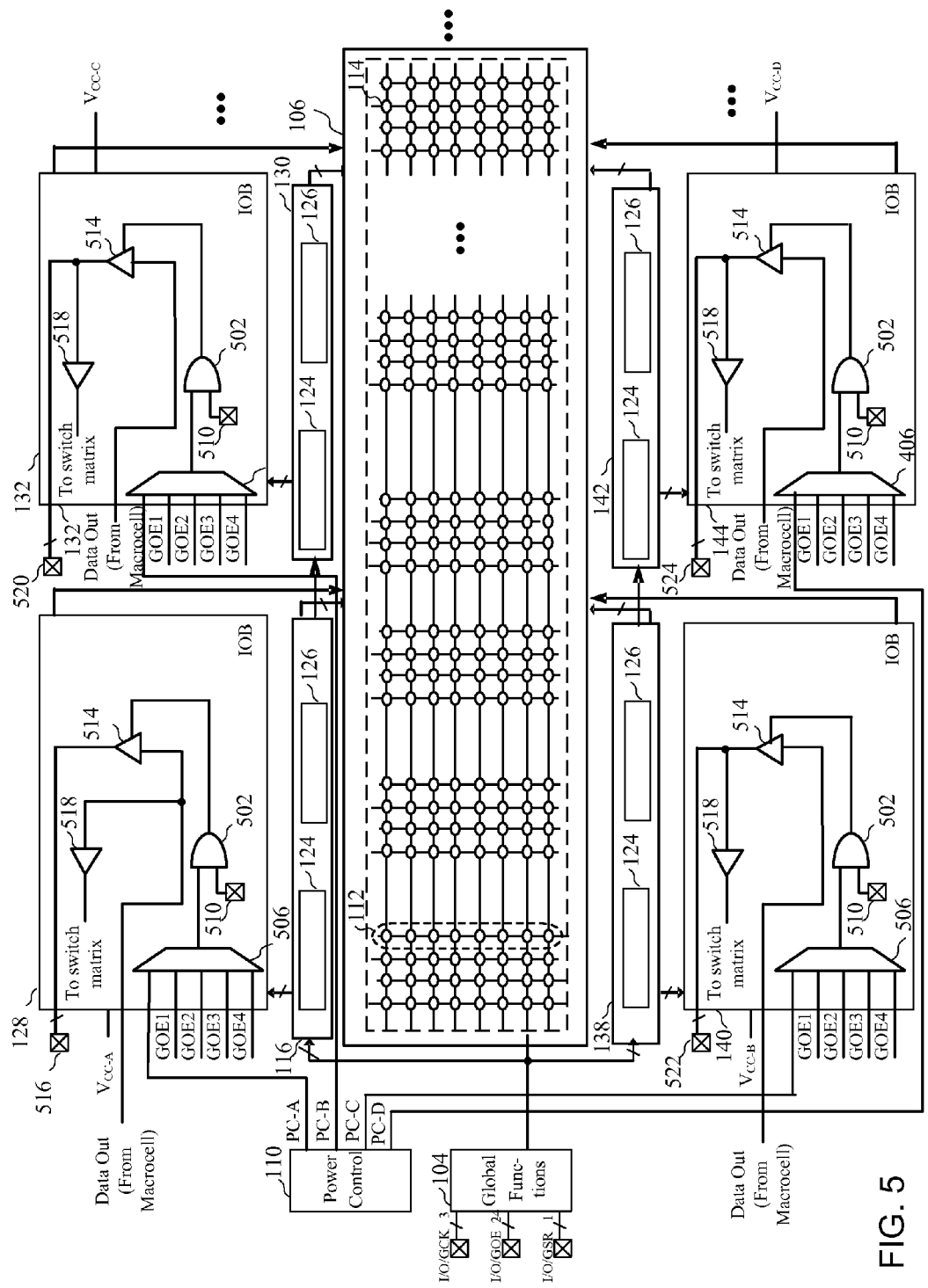
FIG. 5 is a block diagram of a circuit minimizing power consumption in input/output blocks coupled to a plurality of function blocks of a CPLD according to an embodiment of the present invention.

Turning now to FIG. 5, a block diagram of a circuit minimizing power consumption in input/output blocks coupled to a plurality of function blocks according to an embodiment of the present invention is shown. In particular, the input/output block 128 includes an AND gate 502 coupled to receive the output of a multiplexer 506 receiving a plurality of global enable (GE) signals and a power control signal PC-A. The AND gate 502 also receives a power control enable signal 510. The output of the AND gate 502 is coupled to a control terminal of a tri-state buffer 514 which is coupled to receive data from a macrocell at its input and coupled to an input/output terminal 516 of the device. A second buffer 518 coupled to the switch matrix may also be coupled to the output of the tri-state buffer 514. By disabling the tri-state buffer 514, the circuit of FIG. 5 also minimizes power consumption in the programmable logic device. Although a tri-state buffer is shown, other types of output buffers or circuits may be employed in the circuit of FIG. 5. For example, the circuit could decouple the output data from the macrocell to the input of some other type of output buffer. Input/output blocks 132, 138 and 142 also minimize power consumption to input/output pins 520, 522 and 524, respectively.

Figure 6:
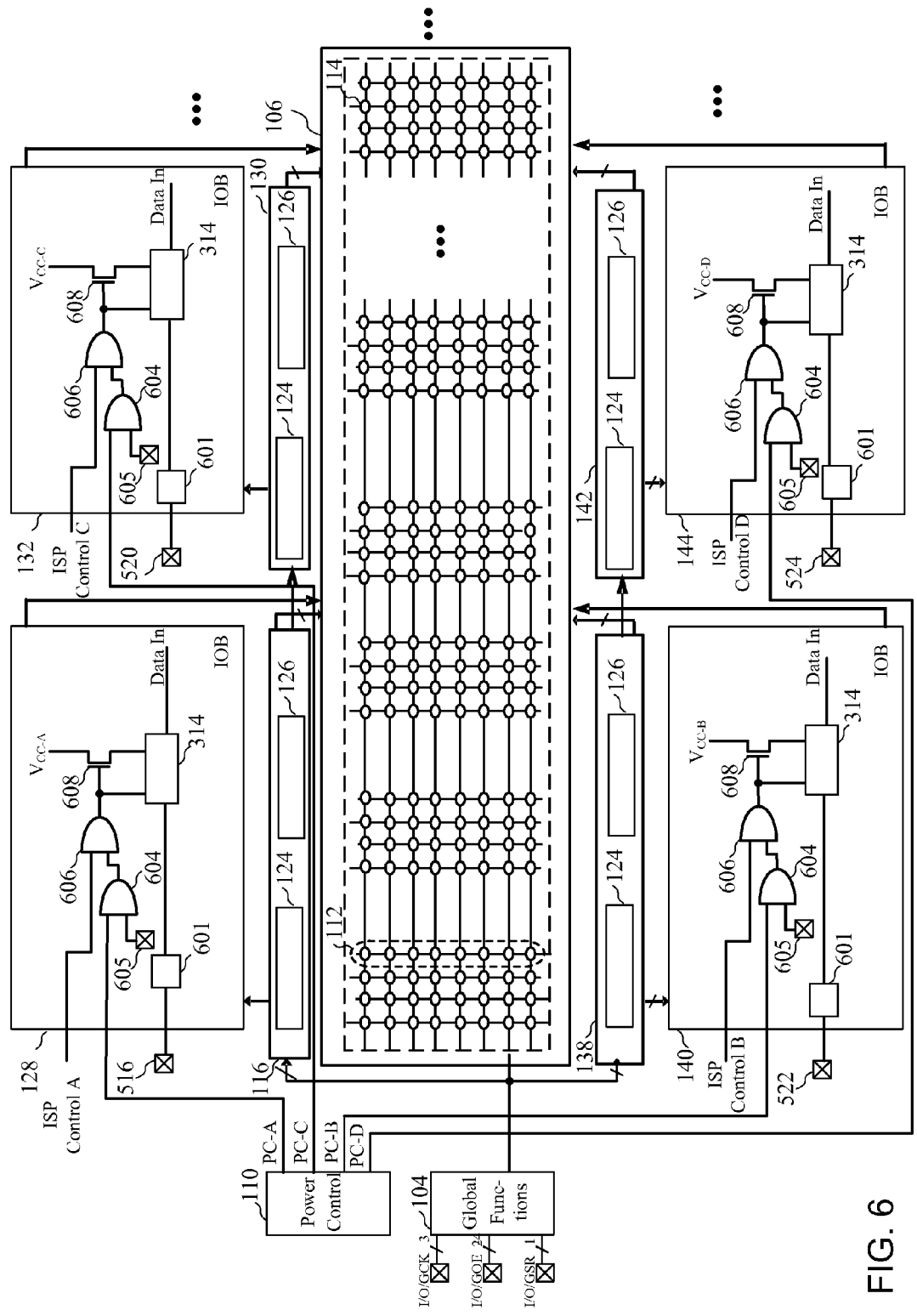
FIG. 6 is a block diagram of a circuit minimizing power consumption in input/output blocks coupled to a plurality of function blocks of a CPLD according to an alternate embodiment of the present invention.

Turning now to FIG. 6, a block diagram of a circuit minimizing power consumption in input/output blocks coupled to a plurality of function blocks according to an alternate embodiment of the present invention is shown. In particular, data from the input/output terminal 516 is coupled to an input selection circuit 601. As will be described in more detail in reference to FIG. 11, the input selection circuit 601 enables the selection of one of a plurality of input buffers for different operating voltages of the circuit. The output of the input selection circuit is coupled to the power control enable circuit 314. An AND gate 604 is coupled to receive a power control signal PC-A and a power control enable signal 605. The output of the AND gate 604 is coupled to a second AND gate 606 which his also coupled to receive an In-System Programming (ISP) Control A signal. The ISP control signal enables coupling programming data received at an input/output terminal. The output of the AND gate 606 is coupled to the gate of a transistor 608 for coupling or decoupling the power supply signal $V_{CC-A}$ to the power control circuit. Accordingly, the power control enable signal will control whether input data coupled to the input/output terminal 516 is coupled to other portions of the device, such as an AND array.

Because a different power signal of the plurality of power signals is coupled to different circuit blocks in the circuits of FIGS. 3-6, controlling power in a given circuit block according to the embodiment of FIG. 1 enables controlling power in circuit blocks receiving one of a plurality of different operating voltages $V_{CC-A}$-$V_{CC-D}$. That is, the power control signals may also be used to reduce power consumption for circuits based upon the operating voltage coupled to the circuit. Although the circuits of FIGS. 3-6 are shown minimizing power consumption in certain circuits, power could also be minimized in other circuits or a combination of the circuits according to the various embodiments of the present invention. Similarly, although the specific application of power control circuits of FIGS. 3-6 are based upon a power control signal being applied to function blocks as shown in FIG. 1, the power control signals could also be applied in FIGS. 3-6 according to the embodiment of FIG. 2, where a given power control signal is applied to similar circuit blocks, such as input/output blocks. While the circuits of FIGS. 1-6 generally show CPLDs by way of example, the circuits for minimizing power consumption could be employed in any device.

Figure 7:
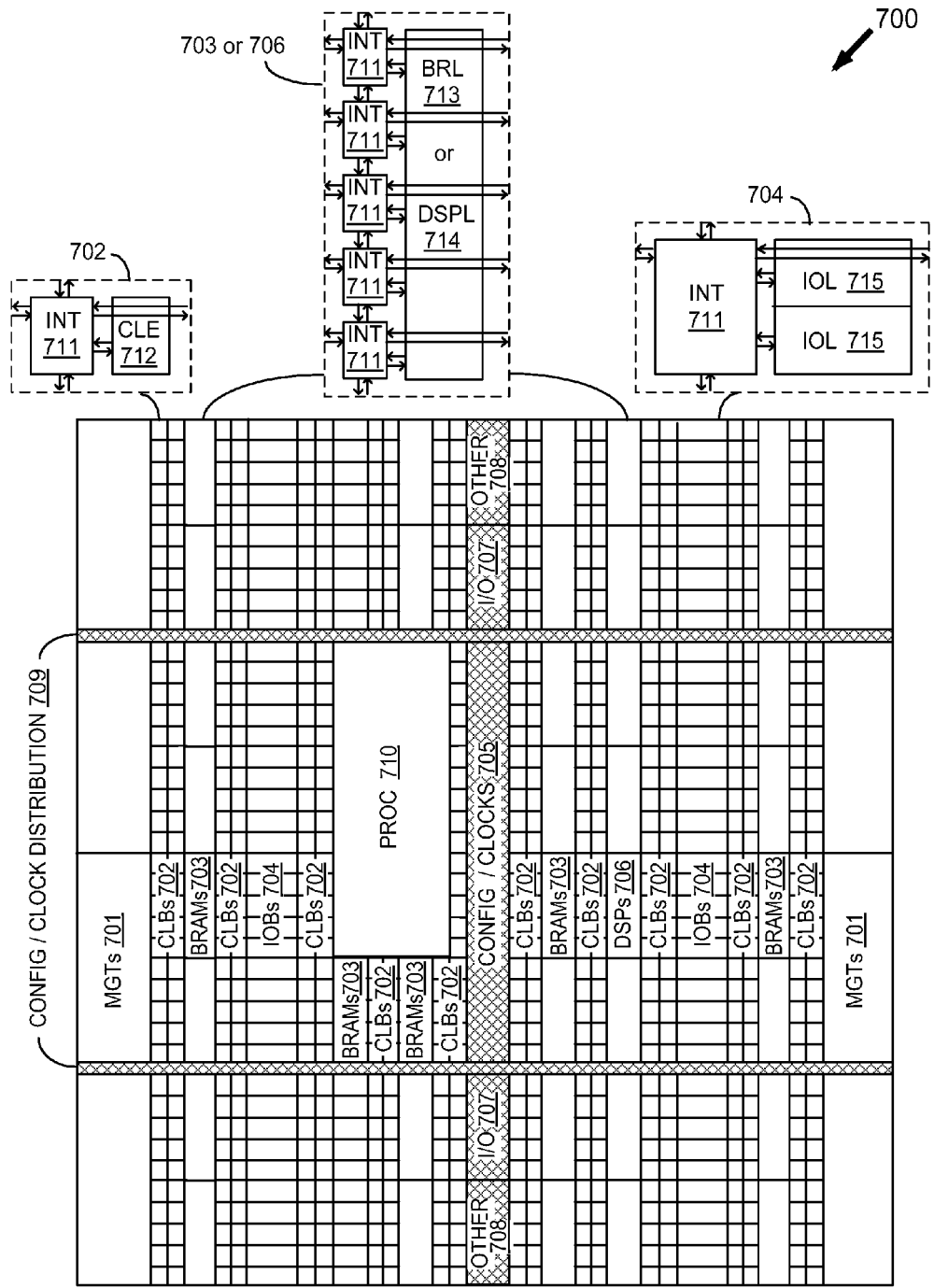
FIG. 7 is a block diagram of a field programmable gate array according to an embodiment of the present invention.

Turning now to FIG. 7, a block diagram of a field programmable gate array according to an embodiment of the present invention is shown. As noted above, advanced FPGAs may include several different types of programmable logic blocks in the array. For example, FIG. 7 illustrates an FPGA architecture that includes a large number of different programmable tiles including circuits for performing logic functions. For example, the programmable tiles may include programmable logic including multi-gigabit transceivers (MGTs 701), configurable logic blocks (CLBs 702), random access memory blocks (BRAMs 703), input/output blocks (IOBs 704), configuration and clocking logic (CONFIG/CLOCKS 705), digital signal processing blocks (DSPs 706), specialized input/output blocks (I/O 707) (e.g., configuration ports and clock ports), and other programmable logic 708 such as digital clock managers, analog-to-digital converters, system monitoring logic, and so forth. Some FPGAs also include dedicated processor blocks (PROC 710).

In some FPGAs, each programmable tile includes a programmable interconnect element (INT 711) having standardized connections to and from a corresponding interconnect element in each adjacent tile. Therefore, the programmable interconnect elements taken together implement the programmable interconnect structure for the illustrated FPGA. The programmable interconnect element (INT 711) also includes the connections to and from the programmable logic element within the same tile, as shown by the examples included at the top of FIG. 7.

For example, a CLB 702 may include a configurable logic element (CLE 712) that may be programmed to implement user logic plus a single programmable interconnect element (INT 711). A BRAM 703 may include a BRAM logic element (BRL 713) in addition to one or more programmable interconnect elements. Typically, the number of interconnect elements included in a tile depends on the height of the tile. In the pictured embodiment, a BRAM tile has the same height as four CLBs, but other numbers (e.g., five) may also be used. A DSP tile 706 may include a DSP logic element (DSPL 714) in addition to an appropriate number of programmable interconnect elements. An IOB 704 may include, for example, two instances of an input/output logic element (IOL 715) in addition to one instance of the programmable interconnect element (INT 711). As will be clear to those of skill in the art, the actual I/O pads connected, for example, to the I/O logic element 715 typically are not confined to the area of the input/output logic element 715.

In the pictured embodiment, a columnar area near the center of the die (shown shaded in FIG. 7) is used for configuration, clock, and other control logic. Horizontal areas 709 extending from this column are used to distribute the clocks and configuration signals across the breadth of the FPGA.

Some FPGAs utilizing the architecture illustrated in FIG. 7 include additional logic blocks that disrupt the regular columnar structure making up a large part of the FPGA. The additional logic blocks may be programmable blocks and/or dedicated logic. For example, the processor block PROC 710 shown in FIG. 7 spans several columns of CLBs and BRAMs.

Note that FIG. 7 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 7 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA. As will be described in more detail in reference to FIG. 8, power control signals may also be employed in an FPGA to reduce power consumption.

Figure 8:
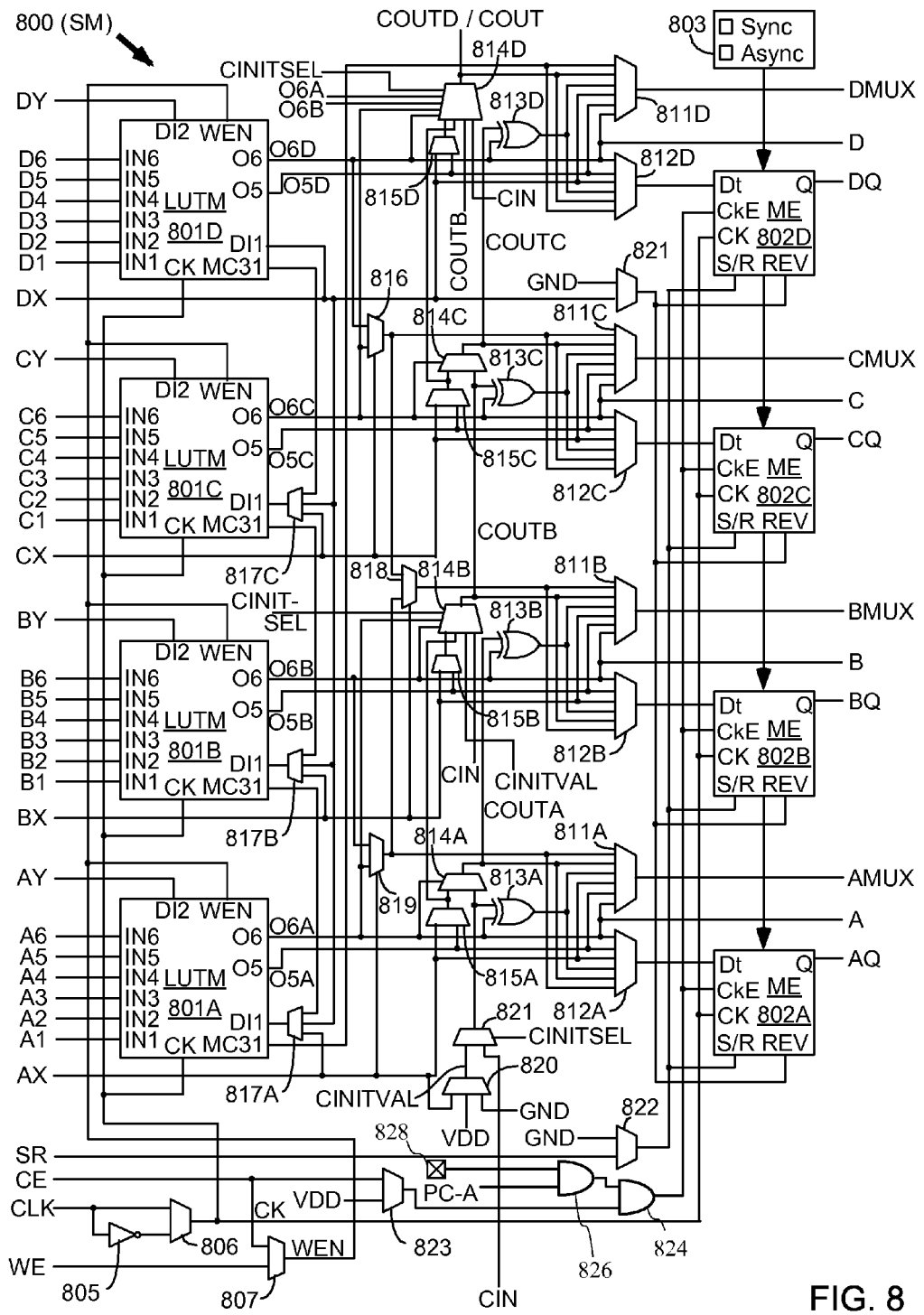
FIG. 8 is a block diagram of configurable logic element of the field programmable gate array of FIG. 7 according to an embodiment of the present invention.

Turning now to FIG. 8, a block diagram of configurable logic element of the field programmable gate array of FIG. 7 according to an embodiment of the present invention is shown. In particular, FIG. 8 illustrates in simplified form a configurable logic element of a configuration logic block 702 of FIG. 7 including circuits having programmable logic. In the embodiment of FIG. 8, slice M 801 includes four lookup tables (LUTMs) 801A-801D, each driven by six LUT data input terminals A1-A6, B1-B6, C1-C6, and D1-D6 and each providing two LUT output signals O5 and O6. The O6 output terminals from LUTs 801A-801D drive slice output terminals A-D, respectively. The LUT data input signals are supplied by the FPGA interconnect structure via input multiplexers, which may be implemented by programmable interconnect element 711, and the LUT output signals are also supplied to the interconnect structure. Slice M also includes: output select multiplexers 811A-811D driving output terminals AMUX-DMUX; multiplexers 812A-812D driving the data input terminals of memory elements 802A-802D; combinational multiplexers 816, 818, and 819; bounce multiplexer circuits 822-723; a circuit represented by inverter 805 and multiplexer 806 (which together provide an optional inversion on the input clock path); and carry logic including multiplexers 814A-814D, 815A-815D, 820-821 and exclusive OR gates 813A-813D. All of these elements are coupled together as shown in FIG. 8. Where select inputs are not shown for the multiplexers illustrated in FIG. 8, the select inputs are controlled by configuration memory cells. That is, configuration bits of the configuration bitstream stored in the configuration memory cells are coupled to the select inputs of the multiplexer to select the correct input to the multiplexer. These configuration memory cells, which are well known, are omitted from FIG. 8 for clarity, as well as from other selected figures herein.

In the pictured embodiment, each memory element 802A-802D may be programmed to function as a synchronous or asynchronous flip-flop or latch. The selection between synchronous and asynchronous functionality is made for all four memory elements in a slice by programming Sync/Asynch selection circuit 803. When a memory element is programmed so that the S/R (set/reset) input signal provides a set function, the REV input terminal provides the reset function. When the memory element is programmed so that the S/R input signal provides a reset function, the REV input terminal provides the set function. Memory elements 802A-802D are clocked by a clock signal CK, which may be provided by a global clock network or by the interconnect structure, for example. Such programmable memory elements are well known in the art of FPGA design. Each memory element 802A-802D provides a registered output signal AQ-DQ to the interconnect structure. Because each LUT 801A-801D provides two output signals, O5 and O6, the LUT may be configured to function as two 5-input LUTs with five shared input signals (IN1-IN5), or as one 6-input LUT having input signals IN1-IN6.

In the embodiment of FIG. 8, each LUTM 801A-801D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 817A-817C for LUTs 801A-801C), or to the two 32-bit RAMs via input terminals DI1 and DI2. RAM write operations in the LUT RAMs are controlled by clock signal CK from multiplexer 806 and by write enable signal WEN from multiplexer 807, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 801A may also be provided to the general interconnect structure for shift register chaining, via output select multiplexer 811D and CLE output terminal DMUX. The circuit of FIG. 8 also includes a circuit for reducing power consumption in the configurable logic element of the FPGA. In particular, a multiplexer 823 is coupled to receive a clock enable (CE) signal at a first input, and a fixed voltage signal, such as $V_{DD}$ at a second input. An AND gate 826 is coupled to receive a power control signal at one input and a power control enable signal at another input. If either the power control signal or the power control enable signal are low, the input to the clock enable is held low, disabling the output registers of the CLE. The circuits of FIGS. 5 and 6 may also be employed in the input/output blocks of the FPGA of FIG. 7. The devices having programmable logic and methods of the present invention may be implemented according to the FPGA device of FIGS. 7 and 8, or in any device, including any type of integrated circuit having programmable logic.

Figure 9:
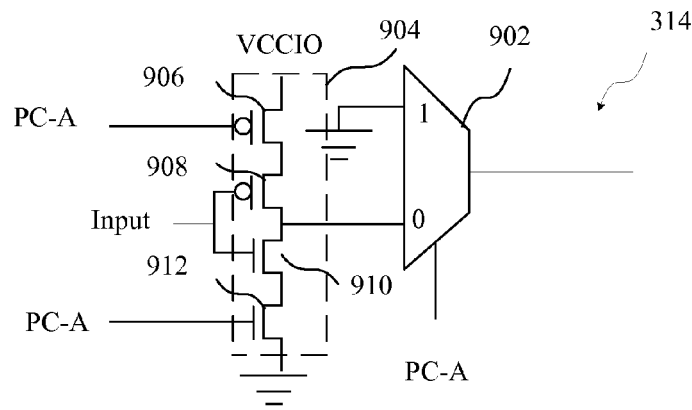
FIG. 9 is a block diagram of an enable circuit selecting an input in response to a power consumption enable signal according to an embodiment of the present invention.
Figure 10:
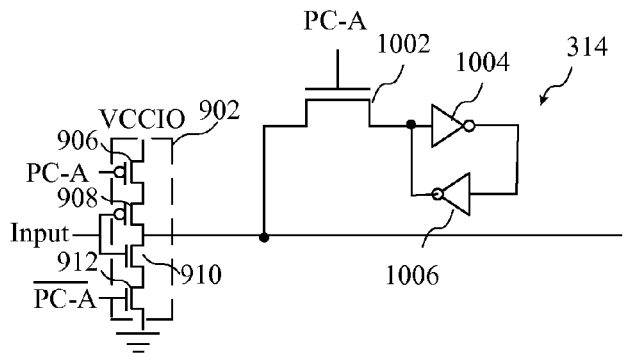
FIG. 10 is a block diagram of an enable circuit selecting an input in response to a power consumption enable signal according to an alternate embodiment of the present invention.

Turning now to FIG. 9, a block diagram of an enable circuit selecting an input in response to an enable signal according to an embodiment of the present invention is shown. Every input/output terminal has an associated enable signal, which may be stored in a memory based upon a bit downloaded as part of a configuration bitstream to the device. In particular, the power control enable circuit 314 includes a multiplexer 902 coupled to receive the output of an inverter 904 including a series of transistors. A first p-channel transistor coupled to a power signal of the inverter 904 is coupled to receive an enable signal at its gate. A p-channel transistor 908 and an n-channel transistor 910 are coupled to receive an input signal at their gates, while an n-channel transistor 912 providing a path to ground is coupled to receive an inverted enable signal. The multiplexer 902 is also coupled to receive a ground signal at an input, and is controlled by the enable signal. Accordingly, the enable signal will control whether the input signal or ground is passed, as described above in FIGS. 3 and 6. For example, when PC-A is low, transistors 906 and 912 are turned on, and the input of the multiplexer is selected to receive the output of the inverter 904. When PC-A is high, the path through the inverter is disabled, and the ground input to the multiplexer is selected. According to the alternate embodiment of FIG. 10, the output of the inverter 904 is coupled by way of a pass transistor 1002, controlled by the enable signal, to a latch including cross-coupled inverters 1004 and 1006. In the embodiment of FIG. 10, when PC-A is low, transistors 906 and 912 are turned on to generate the output of the inverter 904. When PC-A is high, the path through the inverter is disabled, and the output is held by the latch including inverters 1004 and 1006.

Figure 11:
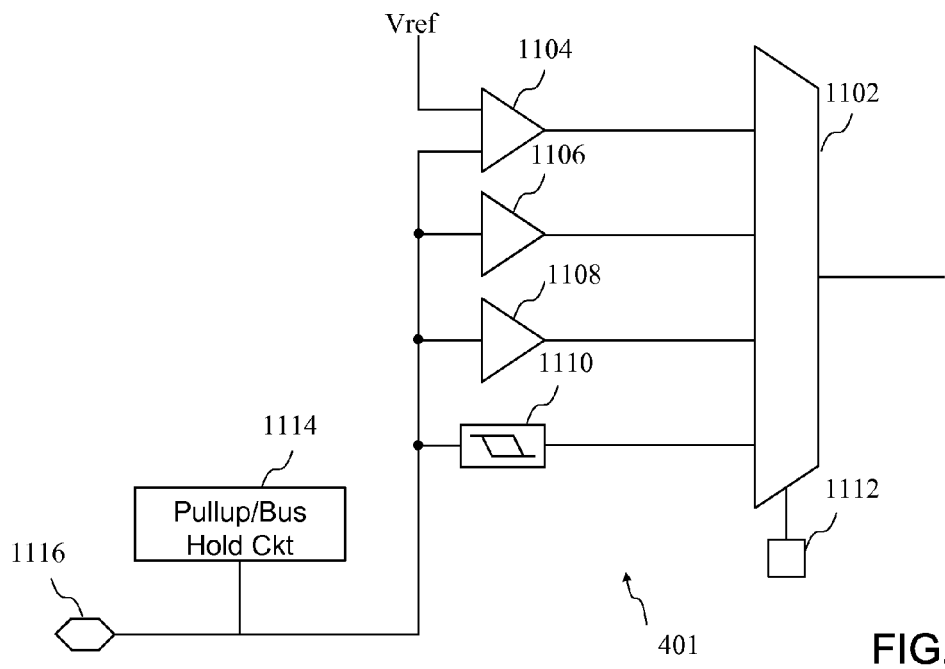
FIG. 11 is a block diagram of a circuit for selecting an input signal at an input/output block according to an embodiment of the present invention.

Turning now to FIG. 11, a block diagram of a circuit for selecting an input signal at an input/output block according to an embodiment of the present invention is shown. In particular, a multiplexer 1102 is coupled to receive inputs from a plurality of input buffers. For example, a first input buffer 1104 includes a comparator coupled to receive the input signal and a reference voltage signal $V_{ref}$. The first input buffer may generate a reference voltage signal including, for example, a 1.8 volt (V) signal. A second input buffer 1106 may include a high voltage input buffer generating a 3.3 V or 2.5 V signal, for example. A third input buffer 908 may include a low voltage input buffer generating a 1.8 V signal, for example. Finally, a Schmitt trigger circuit 1110 may be used to generate any range of voltages, such as 3.3 V, 2.8 V, or 1.5 V, as is well known in the art. The multiplexer is controlled by a control signal 1112 which may be controlled by a value stored in a memory cell, for example, or some other control signal. A pullup/bus hold circuit 1114 is also coupled to an input/output pin 1116.

Figure 12:
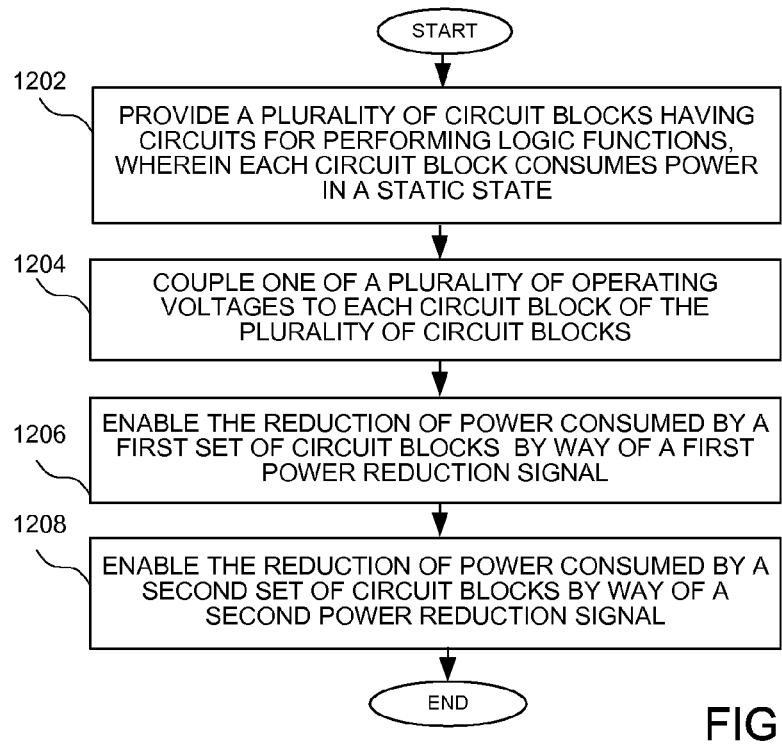
FIG. 12 is a flow chart showing a method of minimizing power consumption in a device having programmable logic according to an embodiment of the present invention.

Turning now to FIG. 12, a flow chart shows a method of minimizing power consumption in a device according to an embodiment of the present invention. In particular, a plurality of circuit blocks having circuits for performing logic functions, such as programmable logic circuit blocks in devices having programmable logic, are provided at a step 1202, wherein each circuit block consumes power in a static state. One of a plurality of operating voltages is coupled to each circuit block of the plurality of circuit blocks at a step 1204. The reduction of power consumed by a first set of circuit blocks is enabled by way of a first power reduction signal at a step 1206. The reduction of power consumed by a second set of circuit blocks is enabled by way of a second power reduction signal at a step 1208. The reduction in power consumed by the first and second set of circuit blocks may be achieved by selectively disabling portions of the circuits as described above with respect to FIGS. 1-11.

Figure 13:
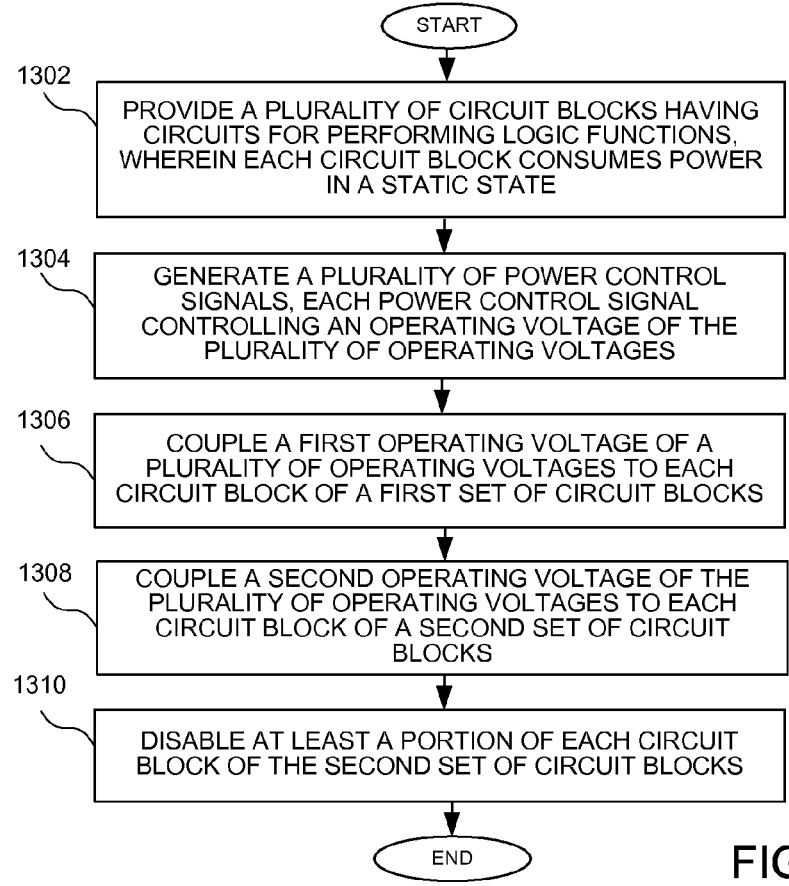
FIG. 13 is a flow chart showing a method of minimizing power consumption in a device having programmable logic according to an alternate embodiment the present invention.

Finally, turning to FIG. 13, a flow chart shows a method of minimizing power consumption in a device according to an alternate embodiment the present invention. In particular, a plurality of circuit blocks having circuits for performing logic functions is provided at a step 1302, wherein each circuit block consumes power in a static state. A plurality of power control signals is generated at a step 1304, wherein each power control signal controls an operating voltage of the plurality of operating voltages. A first operating voltage of a plurality of operating voltages is coupled to each circuit block of a first set of circuit blocks at a step 1306. A second operating voltage of the plurality of operating voltages is coupled to each circuit block of a second set of circuit blocks at a step 1306. Finally, at least a portion of each circuit block of the second set of function blocks is disabled at a step 1310. The method of FIG. 13 may also employ any of the circuits of FIGS. 1-11 as described above, or using any other suitable circuit.

It can therefore be appreciated that the new and novel circuit for and method of minimizing the power consumption in a device has been described. It will be appreciated by those skilled in the art that numerous alternatives and equivalents will be seen to exist which incorporate the disclosed invention. As a result, the invention is not to be limited by the foregoing embodiments, but only by the following claims.

The invention claimed is:

1. A method of minimizing power consumption in a device, the method comprising:
providing a plurality of circuit blocks having circuits for performing functions, wherein each circuit block consumes power in a static state;
coupling one of a plurality of operating voltages to each circuit block of the plurality of circuit blocks;
enabling a reduction of power consumed by a first set of circuit blocks by way of a first power reduction signal generated by a power control circuit and a plurality of corresponding first enable signals stored in first memory elements of the device, wherein a particular one of the first set of circuit blocks is disabled if a corresponding one of the plurality of first enable signals indicates that the particular one of the first set of circuit blocks is to participate in a power reduction mode, and the first power reduction signal specifies that the first set of circuit blocks is to be in the power reduction mode; and
enabling a reduction of power consumed by a second set of circuit blocks by way of a second power reduction signal generated by the power control circuit and a plurality of corresponding second enable signals stored in second memory elements of the device, wherein a particular one of the second set of circuit blocks is disabled if a corresponding one of the plurality of second enable signals indicates that the particular one of the second set of circuit blocks is to participate in the power reduction mode, and the second power reduction signal specifies that the second set of circuit blocks is to be in the power reduction mode.

2. The method of claim 1 wherein enabling a reduction of power consumed by a first set of circuit blocks and a second set of circuit block comprises enabling a reduction of power consumed in a first set of circuit blocks comprising circuit blocks having a first function and in a second set of circuit blocks comprising circuit blocks having a second function.

3. The method of claim 1 wherein enabling a reduction of power consumed by a first set of circuit blocks or a second set of circuit blocks comprises enabling a reduction of power consumed by a set of circuit blocks each from the group consisting of an input/output block, a product term buffer, and a portion of a circuit having programmable logic.

4. The method of claim 1 wherein providing a plurality of circuit blocks having circuits for performing functions comprises providing a plurality of function blocks.

5. The method of claim 4 wherein enabling a reduction of power consumed by a first set of circuit blocks or a second set of circuit blocks comprises disabling AND arrays of the function blocks.

6. The method of claim 4 wherein enabling a reduction of power consumed by a first set of circuit blocks or a second set of circuit blocks comprises disabling an output of macrocells of the function blocks.

7. The method of claim 1 wherein enabling a reduction of power consumed by a first set of circuit blocks or a second set of circuit blocks comprises disabling input/output blocks.

8. A method of minimizing power consumption in a device, the method comprising:
providing a plurality of circuit blocks having circuits for performing functions, wherein each circuit block consumes power in a static state;
generating, by a power control circuit, a plurality of power control signals, each power control signal controlling an operating voltage of the plurality of operating voltages applied to a plurality of circuit blocks;
coupling a first operating voltage of a plurality of operating voltages to each circuit block of a first set of circuit blocks;
coupling a second operating voltage of the plurality of operating voltages to each circuit block of a second set of circuit blocks; and
disabling, by a power control signal of the plurality of power control signals, at least a portion enabling a predetermined function of circuit blocks of the first set of circuit blocks and the second set of circuit blocks if corresponding enable signals associated with the portions enabling the predetermined function and stored in memory elements of the device indicate that the portions enabling the predetermined function of the circuit blocks are to participate in a power reduction mode.

9. The method of claim 8 wherein disabling at least a portion of each circuit block of the second set of circuit blocks comprises disabling a portion of a circuit block based upon an operating voltage applied to the circuit block.

10. The method of claim 8 wherein disabling at least a portion of each circuit block of a second set of circuit blocks comprises disabling a portion of an input/output block.

11. The method of claim 8 wherein disabling at least a portion of each circuit block of a second set of circuit blocks comprises disabling a portion of a product term buffer.

12. The method of claim 8 wherein disabling at least a portion of each circuit block of a second set of circuit blocks comprises disabling a portion of a circuit having programmable logic.

13. The method of claim 8 further comprising selecting one of a plurality of input buffers coupled to an input/output pin of the device.

14. The method of claim 13 wherein selecting one of a plurality of input buffers comprises coupling the plurality of input buffers to a multiplexer.

15. A circuit for minimizing power consumption in a device, the circuit comprising:
a plurality of circuit blocks having circuits for performing functions, wherein each circuit block consumes power in a static state;
a plurality of operating voltages, wherein each circuit block of the plurality of circuit blocks is adapted to receive an operating voltage of the plurality of operating voltages, wherein a first set of circuit blocks of the plurality of circuit blocks receives a first operating voltage and a second set of circuit blocks of the plurality of circuit blocks receives a second operating voltage; and
a power control circuit coupled to the plurality of circuit blocks for coupling one of a plurality of power control signals to each circuit block of the plurality of circuit blocks, wherein the one of the plurality of power control signals is coupled to a portion enabling a predetermined function of circuit blocks of the first set of circuit blocks and the second set of circuit blocks, and the portions enabling a predetermined function of the circuit blocks of the first set of circuit blocks and the second set of circuit blocks are disabled if corresponding enable signals associated with the portions and stored in memory elements of the device indicate that the portions are to participate in a power reduction mode.

16. The circuit of claim 15 wherein each circuit block of the plurality of circuit blocks comprises a power control enable circuit.

17. The circuit of claim 16 wherein said power control enable circuit comprises a multiplexer coupled to select one of an input for a circuit block and a fixed input in response to a power control signal of the plurality of power control signals.

18. The circuit of claim 17 further comprising a plurality of input buffers, wherein a multiplexer is coupled to receive the output of each of the input buffers and a selection input signal.

19. The circuit of claim 18 wherein the circuit is implemented in a programmable logic device.

20. The circuit of claim 19 wherein the selection input signal comprises a programmable memory element.

* * * * *